United States Patent [19]

Schnack

[11] Patent Number: 4,471,293
[45] Date of Patent: Sep. 11, 1984

[54] MULTI-CONDUCTOR CABLE TEST UNIT
[76] Inventor: Otto Schnack, 656 E. Passaic Ave., Bloomfield, N.J. 07003
[21] Appl. No.: 374,186
[22] Filed: May 3, 1982
[51] Int. Cl.³ .............................................. G01R 31/02
[52] U.S. Cl. ......................................... 324/51; 324/66
[58] Field of Search .................................... 324/51, 66

[56] References Cited
U.S. PATENT DOCUMENTS
4,282,479  8/1981  Deboo et al. .......................... 324/51
4,375,050  2/1983  Helgerson ............................. 324/51

Primary Examiner—Stanley T. Krawczewicz
Attorney, Agent, or Firm—M. K. Silverman

[57] ABSTRACT

There is disclosed a cable test unit for use in testing multi-conductor cables containing a plurality of wire pairs. The invention includes means for supplying a constant D.C. voltage; a time-governed oscillator; a recycle pulse generator for releasing sequential pulse outputs; a connector test base having anode and cathode sides; a plurality of LEDs, each corresponding to a respective wire pair, and electrically connected to the test base; means for inhibiting induction across all wire pairs except the pair at which a pulse output from the recycle pulse generator exists; and means for recycling the pulse generator. The current flow characteristic across a given wire pair varies as a function of its structural condition as either a short, open, or crossed circuit, or a loose connection, and such characteristic is reflected in the visual appearance and behavior of the LED corresponding to that wire pair.

1 Claim, 2 Drawing Figures

MULTI-CONDUCTOR CABLE TEST UNIT

BACKGROUND OF THE INVENTION

Multi-conductor cables are widely employed in the tele-communications and data processing fields to connect different pieces of equipment within a system together, or to connect different portions of a single piece of equipment. Typically, a complete cable or cable assembly is constructed of a length of multi-conductor cable having a multi-contact connector at each end for cooperation with mating multi-contact connectors on or in the equipment.

Further, cable assemblies are constructed both in factories and at the point of use of the cable and, in either situation, must be tested to insure that no defects exist in the cable itself, in the connectors, or in the points of connection between conductors and connector contacts. Types of defects which may be found and corrected include breaks in a conductor or its contacts (commonly known as "opens"), unwanted conduction paths between one conductor and another (commonly known as "shorts"), and wiring of a conductor to incorrect contacts at one connector or another (commonly known as crossed wires or "reversals").

Because of the structure of cable assemblies and the fact that cables are typically flexed during installation and, on occasion, during system usage as well, shorts or opens sometimes appear only when the cable is in a certain position or configuration. These types of shorts or opens, which are particularly difficult to locate are commonly known as "intermittent" connections.

The prior art has attempted to develop test systems that are suitable for the detection of the above situations. To the knowledge of the Applicant, the prior art is represented by such patents as U.S. Pat. Nos. 3,514,552; 5,521,161; 3,728,616; 3,818,329; 3,982,1480; 4,074,187; 4,227,146; and 4,223,560. This art has been found to exist essentially in U.S. Class 324, Sub-Classes 51 and 66.

It is as a response to the excessive complexity and cost of those systems reflected in the prior art, that the present invention can be viewed.

SUMMARY OF THE INVENTION

The present invention deals with a cable test unit for a multi-conductor cable having a plurality of wire pairs comprising means for providing a substantially constant direct current voltage supply for the cable test unit; an oscillator having its period governed by a time-constant circuit, the time-constant of said circuit being that of a period easily visible to the human eye; a recycle pulse generator having as its input a clock-regulated output from said oscillator, said pulse generator having a plurality of output pulses, only one of which outputs is provided with a pulse at any time, each of said outputs being provided sequentially with its pulse after the pulse at the prior location has been terminated; a connector test base having a complimentary mating connection for the multi-connector cable to be tested, said test base comprising an anode side and a cathode side, the anode side of said test base connected in parallel with the plurality of outputs of said recycle pulse generator; a plurality of light emitting diodes (LED's), each LED of said plurality corresponding to a respective wire pair of said multi-connector cable, said LED's each electrically connected to the cathode side of said test base, said LED's also electrically connected through the wire pairs of the cable to the anode side of the test base; means for maintaining the respective outputs of the cathode side of the test base at a voltage necessary to inhibit conduction across all wire pairs except that pair at which a pulse output from said recycle pulse generator exists; and means for recycling said pulse generator after a pulse has been provided to each wire pair of the multi-conductor cable, whereby the current flow characteristic across a given wire pair will thereby vary as a function of its structural condition as either a short circuit, open circuit, cross circuit, or a loose connection and such current flow characteristic will be reflected in the visual appearance and behavior of the LED corresponding to a given wire pair of the cable.

Accordingly, it is the object of the present invention to provide a test means for determining the structural integrity of wire pairs of a multi-conductor cable;

It is the further object to provide a means of the above description having a reduced cost and increased ease of usage as compared to such systems existent in the prior art.

Yet further objects and advantages of the present invention will become apparent from the herein set forth detailed description of the invention, the drawings, and the claims affixed herewith.

DETAILED DESCRIPTION OF THE INVENTION

The present cable unit tester is adapted to provide a rapid method for the checking of multi-wire cables which, typically, are mass produced as a production item. As will be seen in the set forth description, the present test unit eliminates the manual, time consuming, and tedious methods of continuity-checking (also known as "buzzing-out") of each and every wire within a cable for shorts, open circuits, and crossed wires.

A cable 10, before testing, is plugged into a mating set of connectors 12 of the cable test unit 14. Each such unit 14 is individually configured for the type of cable to be tested. For example, it is entirely possible that several different types of connectors may be used on one test unit in order to accommodate various types of cables to be tested, as may be the wish of the end user.

Figure 1:
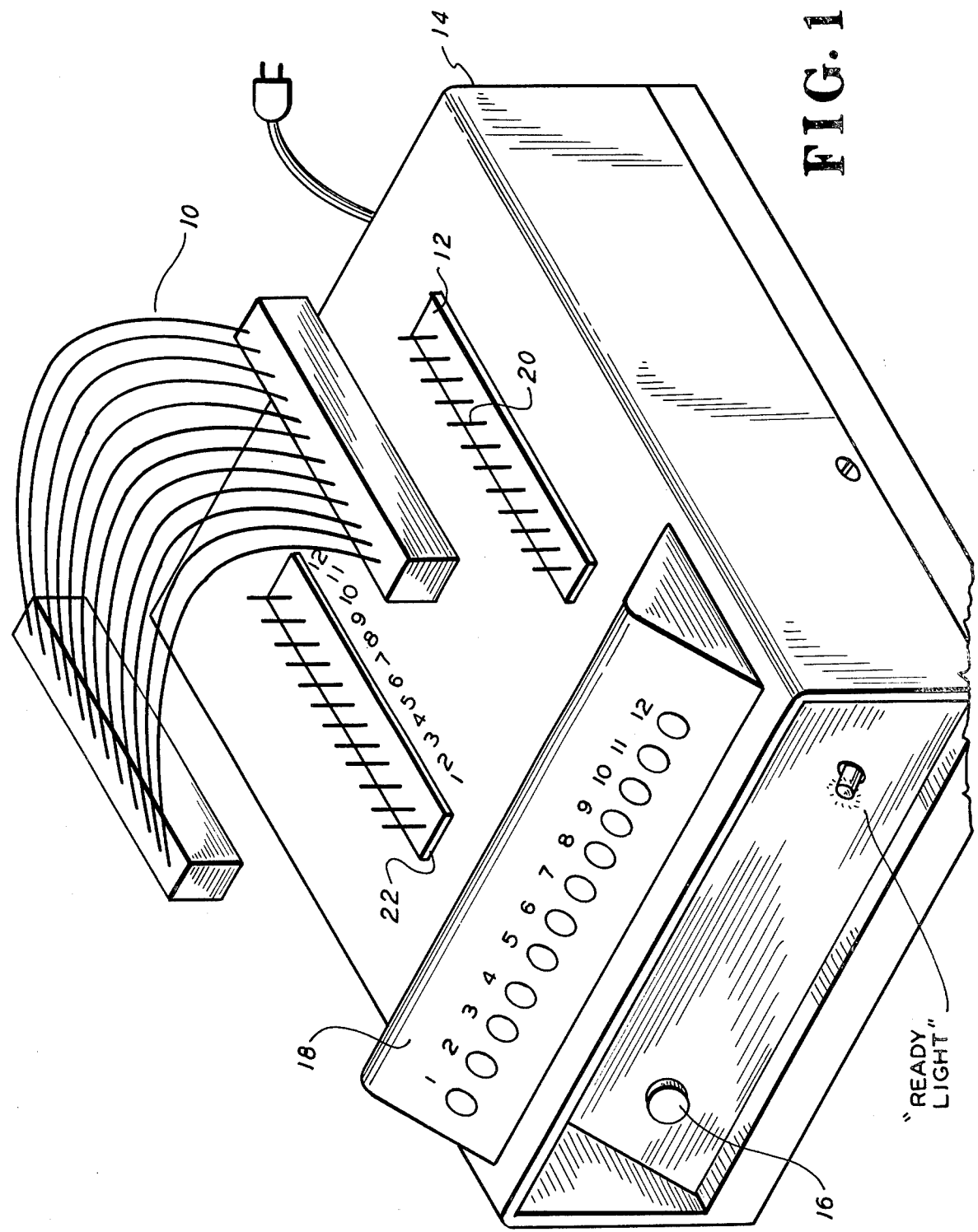
FIG. 1 is a perspective view of the multi-conductor cable test unit.

After the properly oriented cable is plugged into the cable unit tester, thereby completing the circuit within the test unit, the unit is then energized, and a run button 16 is depressed in order to start the automatic sequential testing of each wire. The light emitting diode (hereinafter LED) denoted as No. 1 will always illuminate first, indicating a good wire if such is the case, and will not become illuminated if the wire is not good. After a brief period, e.g., one second, LED 1 extinguishes and LED 2 illuminates for the same period of time. This sequence continues until all of the wires (12 in number shown in the illustration of FIG. 1) in the cable are sampled after which the test unit recycles itself and thereby starts and repeats the checking of each wire.

Manual intervention is necessary to stop the testing, and this is done by either resetting the run button 16 or removing the cable which is under test, and then installing another cable to be tested.

The sampling rate of each wire is arbitrarily set for ease of viewing on the display 18. It is to be appreciated that the design of the display panel may be modified in order to suit the operator. Such modification may include an automatic alarm or stop in order to provide a second means of indication when a defective wire is located.

The present unit will provide a visual indication of shorted wires, open wires, intermittent connections, and crossed wires. In addition, when the cable to be tested is incorrectly oriented with reference to the pins 20 of the test unit, the display 18 will generate an erratic pattern which is not recognizable as containing any standard type of information. Where an intermittent or so-called crossed-wire pair exists, the LED's will illuminate erratically or with less than normal brightness. An open wire will be apparent from the fact that the corresponding LED will not be illuminated at all. In the case of a shorted wire pair, the two affected LED's will illuminate simultaneously, and each will glow with half of the normal level of brightness. Two crossed wires will cause the sequential advance, skip, retrace, skip and advance to the next correctly wired wire pair. In this sensing mode, the erratic operation of the LED's indicates precisely where the crossed wires are located in the cable in that each LED is numbered to correspond to the wire pair being tested.

Figure 2:
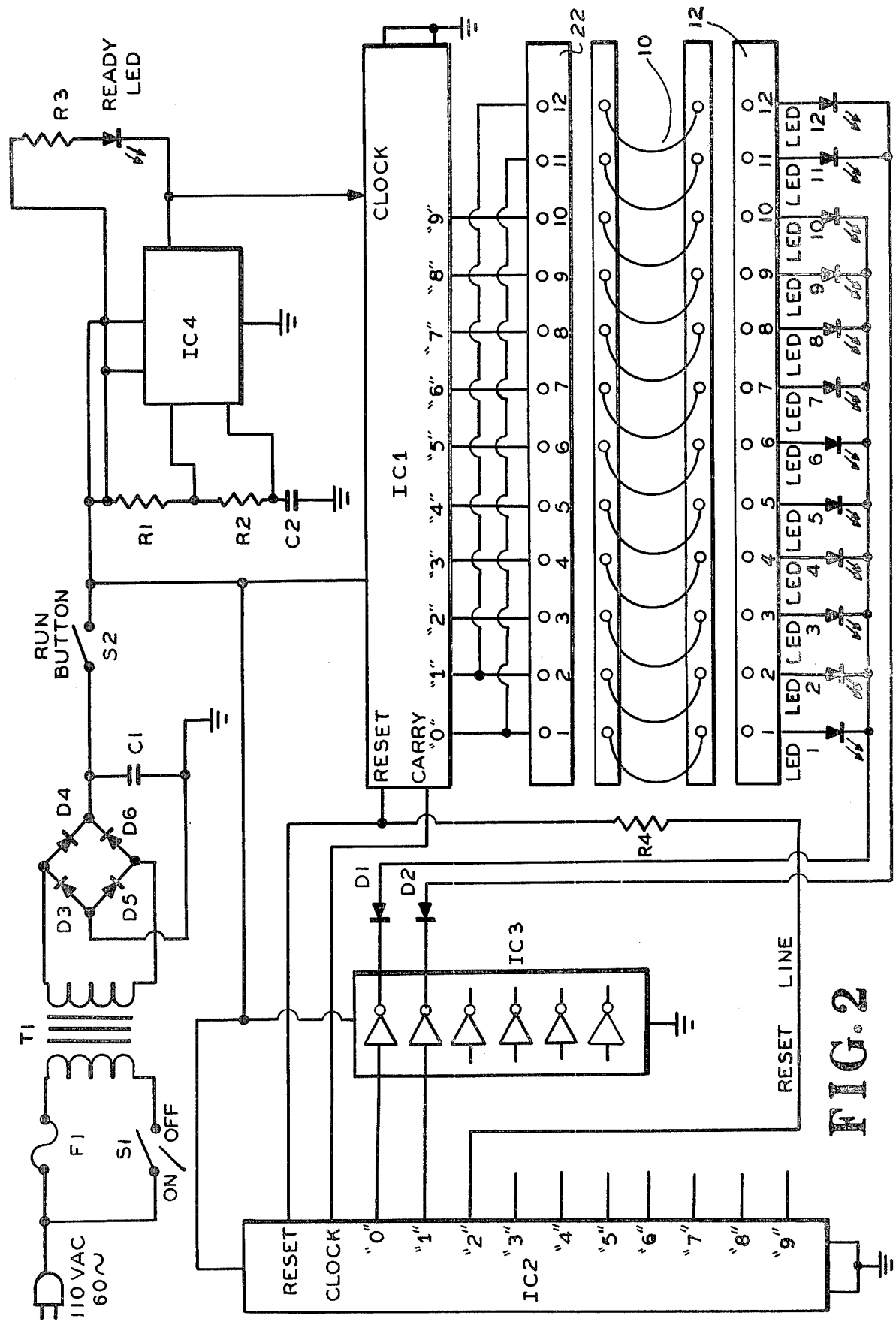
FIG. 2 is an electrical schematic of the present inventive circuit.

With reference now to FIG. 2, the transformer T1, and diode bridge D3-D4-D5-D6 are used in order to provide 9 volts DC which is necessary in order to bias all three of the pulse counters used in the present invention, namely, IC1, IC2, and IC3.

The operation of the circuitry begins with the generation of a so-called carry pulse by IC1 which carry pulse will be generated as an output corresponding to every ten pulses inputted to the system by the oscillator IC4. Each such carry pulse of IC1 will then trigger the counter IC2 which will then pass through a three count progression, thereby producing the necessary voltage level on the cathode side which is electrically connected to LED's 1 through 12. This portion of the circuit appears at the lower right hand side of FIG. 2. The above zero biasing of the return side of the cable pin pair, is necessary in order to assure that each pulse will travel across each wire pair in a normal fashion; this can be assured only if a suitable voltage drop exists across the multi-conductor series. It is, thereby, to be appreciated that the IC2 counter functions to assure the proper biasing of LED 1 through 12 as the pulses of IC1 progress through the test pin pair 12 and 22 of FIG. 1.

IC3 comprises a bank of six inverters in which, however, only two are used in the present design. The additional (unused) inverters have been provided so that the present system may be adapted in order to render it suitable for a greater than twelve pair wire situation. The additional four inverters of IC3 make it possible to construct a test unit having 36 wire pair connections without any change in the principles or concept embodied herein.

D1 and D2 act as simple blocking diodes having as their function the protection of IC2 against any improper transients which might appear on the line and create an unwanted triggering of IC2. After the diode D2 produces a low (0 voltage) at the cathode of LED's 11 and 12, the IC1 counter is recycled as follows: the generation of each carry from IC1 will, as a part of the internal logic of the IC1 counter, cause it to recycle and begin counting from 0. It is noted that each of the numerals enclosed in quotes on the anode side of the IC1 counter represent count numbers of the internal logic of the IC1 counter, whereas each of the numbers on the test base indicate pin locations.

In steady state operation, there will always exist a pulse at one pin position on the IC1 side of the connector base.

Also, the current flow through a particular wire pair is governed by whether or not the pin at the cathode of the connector base is high or low. If the cathode is high, then no current will flow across the wire pair because there is no voltage drop. That is, current will only flow where the cathode pins are kept at zero voltage by the counter pulses generated by IC2, as the same are transmitted through D1 to the output sides of LED's 1 through 10. In other words, the function of IC2 is to bias the cathode side of the connector base to a zero voltage, thereby assuring that only one LED at a time is illuminated and that only one wire pair at a time can be tested.

With further regard to the operation of IC1, it is to be understood that the internal logic of IC1 causes one single pulse to travel, moving from position "0" to position "9", this movement occurring at the rate of one pin a second, ultimately down to the end of the twelve pin test connector so that at any point in time, there exists only one pulse on the anode side of the IC1 connector. This has been referred to as a "walking pulse" function.

As the IC1 begins its first recycle and recount function, it is essential to maintain LED 1 through LED 10 in a high position so that no current will flow across wires 1 through 10 until the first recycle of IC1 has enabled the "walking pulse" to reach wire pair and LED positions 11 and 12. In effect, in the present embodiment, the positions 11 and 12 effectively pick-off the walking pulse of IC1 while lines 1 through 10 are prevented from conducting because both the anode and the cathode side of the test base are clamped into high positions. This apparently awkward circuitry is necessitated by the fact that standardly available pulse counters are available only in decade (1-to-10) count functions, while the most commonly produced cable has twelve wire pairs. Therefore, in order to construct a circuit using standard parts, it is necessary to "work around" the fact that the standard counter operates on a base ten logic while the standard cable presents a twelve position situation. As above noted, minor changes in the present hardware can render the present system suitable for the testing of cables having up to as many as 36 cable pairs.

In summary, it is to be understood that the operation of the circuited FIG. 2 is as follows: the unit, once powered up, will have clocking pulses generated by the oscillator IC4 at a rate of one per second, this rate being determined by the time constant of R1, R2 and C2. These pulses are then used to clock the counter IC1 at a slow rate so that the outputs into the anode side of the test base can pass through the 1 through 10 positions on a sequential basis. This one per second, slow rate permits visual observation of the LED display representing each wire as the test unit operates. The pulse input to IC1 in effect walks along the anode of IC1 until the No. 10 position is reached. Thereafter, a "carry" is produced which is used to clock IC2, the output of which then goes high, is inverted by IC3, and coupled through diode D1 in order to produce a low at the cathode of a test base with reference to LED's 1 through 10.

Prior to this first recycle, LED's 1 through 12 are inhibited by virtue of the fact that wire positions 1 through 12 are kept in a high state until such time as the walking pulse has passed through positions 1 through 10. The counter IC1 is, by its own logic, then recycled, starts counting from zero and generates a "Carry" for clocking IC2 to count "0". During this counting cycle of IC1, wire positions 1 through 10 are examined. When IC1 reaches the count of 10 during this cycle, it is again recycled by its internal logic, generates a "Carry" for clocking IC2 up to count "1", turning off count "0". This in effect reverse biases LED's 1 through 10 and forward biases LED's 11 and 12 so that only wire pairs 11 and 12 will be examined during the next count cycle of IC1. Upon reaching the count of 10, IC1 for the third time recycles itself, generates a "Carry" for clocking IC2 up to count "2", which now produces a reset pulse to both IC1 and IC2. This resets both counters to their start positions. The above process will repeat continually as long as IC1 receives pulses from the oscillator IC4.

In the above circuit it has been found that the current flow characteristic across a given wire pair will thereby vary as a function of its structural condition as either a short circuit, open circuit, crossed circuit, or loose connection, and such current flow characteristic will be reflected in the visual appearance and behavior of the LED corresponding to a given wire pair of the cable.

While there have been shown and described the preferred embodiments of the present invention, it will be understood that the invention may be embodied otherewise than as herein specifically illustrated or described and that within said embodiments certain changes in the detail and construction, and the form of arrangement of the parts may be made without departing from the underlying idea or principles of this invention within the scope of the appended claims.

Having thus described my invention, what I claim as new, useful and non-obvious and accordingly secure by letters patent of the United States is:

1. A cable test unit for a multi-conductor cable having a plurality of wire pairs, comprising:

(a) means for providing a substantially constant direct current voltage supply for the test unit;

(b) an oscillator having its period governed by a time-constant circuit, the time constant of said circuit being that of a period easily visible to the human eye;

(c) a recycle pulse generator having as its input a clock-regulated output from said oscillator, said pulse generator having a plurality of pulse outputs, only one of which outputs provided with a pulse at any one time, each of said outputs being provided sequentially with its pulse after the pulse at the prior output location has terminated;

(d) a connector test base having a complementary mating connection for the multi-connector cable to be tested, said test base comprising an anode side and a cathode side, the anode side of said test base connected in parallel with the plurality of outputs of said recycle pulse generator;

(e) a plurality of light emitting diodes (LED's), each LED of said plurality corresponding to a respective wire pair of said multi-conductor cable, said LED's each electrically connected to the cathode side of said test base, said LED's also electrically connected, through the wire pairs of the multi-conductor cable, to the anode side of the test base;

(f) means for maintaining the respective outputs of the cathode side of the test base at a voltage necessary to inhibit conduction across all wire pairs except that pair at which a pulse output from said recycle pulse generator exists; and (g) means for recycling said pulse generator after a pulse has been provided to the last wire pair of the multi-conductor cable, whereby the current flow characteristic across a given wire pair will thereby vary as a function of its structural condition as either a short circuit, open circuit, crossed circuit, or loose connection, and such current flow characteristic will be reflected in the visual appearance and behavior of the LED corresponding to a given wire pair of the cable.

* * * * *